United States Patent
Lee

(10) Patent No.: US 7,961,548 B2
(45) Date of Patent: *Jun. 14, 2011

(54) SEMICONDUCTOR MEMORY DEVICE HAVING COLUMN DECODER

(75) Inventor: Ihl-Ho Lee, Kyoungki-do (KR)

(73) Assignee: Hynix Semiconductor Inc., Hyoungki-Do (KR)

( * ) Notice: Subject to any disclaimer, the term of this patent is extended or adjusted under 35 U.S.C. 154(b) by 4 days.

This patent is subject to a terminal disclaimer.

(21) Appl. No.: 12/472,329

(22) Filed: May 26, 2009

(65) Prior Publication Data

US 2009/0231946 A1  Sep. 17, 2009

Related U.S. Application Data

(63) Continuation of application No. 11/524,027, filed on Sep. 19, 2006, now Pat. No. 7,548,484.

(30) Foreign Application Priority Data

Sep. 29, 2005  (KR) .................. 10-2005-0090969
Dec. 16, 2005  (KR) .................. 10-2005-0124565

(51) Int. Cl.
*G11C 8/00*  (2006.01)

(52) U.S. Cl. ................... 365/230.06; 365/229

(58) Field of Classification Search .............. 365/226, 365/229, 229 X, 230.06, 230.06 O
See application file for complete search history.

(56) References Cited

U.S. PATENT DOCUMENTS

| | | | |
|---|---|---|---|
| 5,311,467 A | 5/1994 | Lysinger et al. | |
| 5,511,026 A | 4/1996 | Cleveland et al. | |
| 5,909,140 A | 6/1999 | Choi | 327/534 |
| 6,252,819 B1 | 6/2001 | Voss | |
| 6,269,046 B1 | 7/2001 | Lee et al. | |
| 6,324,098 B1 | 11/2001 | Condemi et al. | |
| 6,421,296 B1 | 7/2002 | Lin et al. | |
| 6,535,430 B2 | 3/2003 | Ogura et al. | 365/185.23 |
| 6,545,898 B1 | 4/2003 | Scheuerlein | |
| 6,574,140 B2 | 6/2003 | Caywood | |
| 6,804,148 B2* | 10/2004 | Bedarida et al. | 365/185.13 |
| 7,184,358 B2 | 2/2007 | Kobayashi et al. | 365/230.06 |
| 7,203,097 B2 | 4/2007 | Choi et al. | 365/185.27 |
| 7,319,616 B2* | 1/2008 | Sundaram et al. | 365/185.23 |

FOREIGN PATENT DOCUMENTS

| | | |
|---|---|---|
| CN | 1233839 A | 11/1999 |
| CN | 1495904 A | 5/2004 |
| JP | 2000-113670 | 4/2000 |

(Continued)

*Primary Examiner* — VanThu Nguyen

(74) *Attorney, Agent, or Firm* — Blakely, Sokoloff, Taylor & Zafman LLP

(57) ABSTRACT

A semiconductor memory device includes a cell matrix having a number of cells, a multiplicity of column decoders for selectively activating the cells in response to code signals containing column address information for the cells, wherein each column decoder contains a pre-driving unit for providing a state output signal transiting between a power supply voltage and a source voltage in response to the code signals and a driving unit for outputting a column selection signal to activate a corresponding cell in response to the state output signal, wherein the pre-driving unit and the driving unit include at least one PMOS transistor and at least one NMOS transistor receiving a pumping voltage and a back-bias voltage, respectively, through their bulk, the pumping voltage having a voltage level higher than that of the power supply voltage and the back-bias voltage having a voltage level lower than that of a ground voltage.

12 Claims, 6 Drawing Sheets

FOREIGN PATENT DOCUMENTS

| | | |
|---|---|---|
| JP | 2000-182377 A | 6/2000 |
| JP | 2002-353345 | 12/2002 |
| KR | 1998-018899 | 6/1998 |
| KR | 2001-0059020 | 7/2001 |
| TW | 586122 | 5/2004 |
| TW | 1235379 | 7/2005 |

* cited by examiner

| | 1 BANK (128M) | Voltage Generator | Peri |
|---|---|---|---|
| OFF-LEAKAGE CURRENT | 40.2uA | 6.2uA | 12.4uA |

SEMICONDUCTOR MEMORY DEVICE HAVING COLUMN DECODER

CROSS-REFERENCES TO RELATED APPLICATIONS

This application is a continuation of application Ser. No. 11/524,027, filed Sep. 19, 2006, now U.S. Pat. No. 7,548,484 which application claims priority to Korean patent application numbers 10-2005-0090969 and 10-2005-0124565, filed on Sep. 29, 2005 and Dec. 16, 2005, respectively, which are incorporated by reference in their entirety.

BACKGROUND OF THE INVENTION

The present invention relates to a semiconductor memory device, and more particularly to a technique for controlling a bulk bias voltage for a column decoder in a bank in which a large amount of off-leakage current occurs.

A dynamic random access memory (DRAM) device has an advantage of very large integration over other memory devices since it employs memory cells each of which is constructed with a transistor and a capacitor. Further, the DRAM device has been advanced in operational speed as various techniques have been proposed in conformity with recent high-speed requirements.

Accordingly, a DRAM device having the advanced driving capability at even a low voltage has been developed, and further, such DRAM device has been gradually spread to applications such as appliances and mobiles consuming a low power as well as a main memory of a computer.

It, however, becomes more and more difficult to implement a low standby current due to the high integration of the semiconductor memory device, wherein ensuring the low standby current means the minimization of off-leakage current for each device.

FIG. 1 is a table showing a value of off-leakage current per component calculated by summing widths of transistors presented in each of the components of a semiconductor memory device, e.g., a bank, a voltage generator and peripheral circuits.

The off-leakage currents occurring in the bank, the voltage generator and the peripheral circuits are 40.2 µA, 6.2 µA and 12.4 µA, respectively.

In conclusion, most of the total widths of transistors and thus off-leakage currents in the semiconductor memory device are substantially taken by transistors assigned to the bank. In particular, it is a column decoder that takes the largest width and the greatest amount of off-leakage current in the bank, and inter alia, the off-leakage currents occurring in a final driving unit and a pre-driving unit of the column decoder take up 42.8% of off-leakage currents occurring in the bank as can be seen from FIG. 2.

FIG. 2 shows a simulative result for an off-leakage current level per element obtained by producing the off-leakage current in each element of the bank. As can be seen from the simulative result, the off-leakage current produced by the column decoder takes up more than 50%.

FIG. 3 illustrates a detailed circuit diagram of a conventional column decoder 5 in a semiconductor memory device.

The conventional column decoder 5 includes a pre-driving unit 1 and a driving unit 2.

The pre-driving unit 1 has a PMOS transistor P1 and NMOS transistors N1 to N3 connected in series between a power supply voltage terminal VDD and a ground voltage terminal VSS. The PMOS transistor P1 and the NMOS transistor N1 have a common gate and are provided with a control signal BYP through the common gate, the control signal BYP being a pulse signal containing bank information. Further, they have a common drain which acts as an output node of the pre-driving unit 1 to output a state output signal to the driving unit 2. The NMOS transistors N2 and N3 receives code signals YCOD1 and YCOD2 through their gates, respectively, wherein each of the code signals YCOD1 and YCOD2 has a code containing column address information for a corresponding cell of a multiplicity of cells in a cell matrix 3 in the semiconductor memory device.

The driving unit 2 has a PMOS transistor P2 and an NMOS transistor N4 connected in series between the power supply voltage terminal VDD and the ground voltage terminal VSS. The PMOS transistor P2 and the NMOS transistor N4 have a common gate acting as an input node of the driving unit 2 and a common drain acting as an output node of the driving unit 2.

The input node of the driving unit 2 is connected with the output node of the pre-driving unit 1 to receive the state output signal from the pre-driving unit 1. If a certain condition is met as described later, the driving unit 2 generates a corresponding column selection signal, e.g., Yi0, to the cell matrix 3. The column selection signal Yi0 indicates an address of the corresponding cell, commonly designated by the two-code signals YCOD1 and YCOD2, in the cell matrix 3.

The PMOS transistors P1 and P2 receive a power supply voltage VDD through their bulk and the NMOS transistors N1 to N4 receive a ground voltage VSS through their bulk.

For the purpose of forming one bank, a plurality of above-assembled column decoders are required and thus a plurality of column selection signals, e.g., Yi0 to Yin, are outputted to the cell matrix 3, n being a positive integer.

The pre-driving unit 1 receives the code signals YCOD1 and YCOD2 required for the column selection and selects one of the column decoders into which the code signals YCOD1 and YCOD2 having an enabled state, e.g., a logic high level, are inputted, thereby enabling a corresponding column selection signal, e.g., Yi0.

More specifically, when a column access operation for the column selection is not performed, the control signal BYP has a disabled state, e.g., a logic low level, thereby setting the column selection signal Yi to a disabled state, e.g., a logic low level. On the other hand, when the column access operation for the column selection is performed, the control signal BYP is enabled to a logic high level. When the control signal BYP is enabled, if the code signals corresponding to a certain one of the column decoders have the enabled state, the pre-driving unit 1 of the certain column decoder is enabled, such that the PMOS transistor P2 of the driving unit 2 is turned on and thus the column selection signal Yi0 is enabled and outputted to the cell matrix 3.

There is a need to reduce off-leakage currents in the semiconductor memory device by controlling the column decoder in which a substantially large amount of the off-leakage current occurs.

BRIEF SUMMARY OF THE INVENTION

An embodiment of the invention is a semiconductor memory device for reducing the total off-leakage current by controlling a column decoder in which the greatest amount of off-leakage current occurs.

Further, an embodiment of the invention is a semiconductor memory device for selectively controlling a voltage level of a source voltage of a column decoder, thereby improving an operational speed.

In accordance with an aspect of the present invention, there is provided a semiconductor memory device including:

a cell matrix including a plurality of cells;

a column decoding unit having a multiplicity of column decoders for selectively activating the cells in response to code signals containing column address information for the cells, wherein each of the column decoders includes a pre-driving unit for providing a state output signal transiting between a power supply voltage and a source voltage in response to the code signals, and a driving unit for outputting a column selection signal to activate a corresponding one of the cells in response to the state output signal, wherein each of the pre-driving unit and the driving unit includes at least one PMOS transistor and at least one NMOS transistor receiving a pumping voltage and a back-bias voltage, respectively, through their bulk, the pumping voltage having a voltage level higher than that of the power supply voltage and the back-bias voltage having a voltage level lower than that of a ground voltage.

In accordance with another aspect of the present invention, there is provided a semiconductor memory device including:

a plurality of banks each of which has a cell matrix having a plurality of cells, a column decoding unit having a multiplicity of column decoders for selectively activating the cells in response to code signals containing column address information for the cells, wherein each of the column decoders contains a pre-driving unit for providing a state output signal transiting between a power supply voltage and a source voltage in response to the code signals, and a driving unit for outputting a column selection signal to activate a corresponding one of the cells in response to the state output signal, wherein each of the pre-driving unit and the driving unit includes at least one PMOS transistor and at least one NMOS transistor receiving a pumping voltage and a back-bias voltage, respectively, through their bulk, the pumping voltage having a voltage level higher than that of the power supply voltage and the back-bias voltage having a voltage level lower than that of a ground voltage; and a source voltage control unit for providing the plurality of banks with the source voltage whose voltage level changes depending on operational modes of the banks.

In accordance with still another aspect of the present invention, there is provided a semiconductor memory device including:

a plurality of banks each of which has a cell matrix having a plurality of cells, a column decoding unit having a multiplicity of column decoders for selectively activating the cells in response to code signals containing column address information for the cells, wherein each of the column decoders contains a pre-driving unit for providing a state output signal transiting between a power supply voltage and a source voltage in response to the code signals, and a driving unit for outputting a column selection signal to activate a corresponding one of the cells in response to the state output signal, wherein each of the pre-driving unit and the driving unit includes at least one PMOS transistor and at least one NMOS transistor receiving a pumping voltage and a back-bias voltage, respectively, through their bulk, the pumping voltage having a voltage level higher than that of the power supply voltage and the back-bias voltage having a voltage level lower than that of a ground voltage; and a plurality of source voltage control units respectively for providing the plurality of banks with corresponding source voltages whose voltage level changes depending on operational modes of the banks.

DETAILED DESCRIPTION OF THE INVENTION

A semiconductor memory device in accordance with specific embodiments of the present invention includes a column decoding unit and a cell matrix, wherein the column decoding unit includes a plurality of column decoders.

Figures 1, 2:
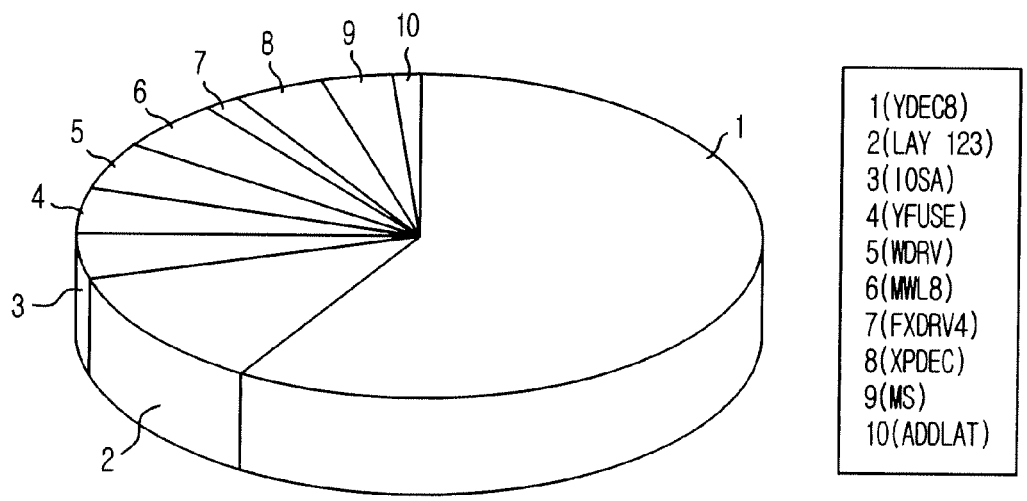
FIG. 1 is a table showing off-leakage current per component calculated by summing widths of transistors presented in each of a number of components used in a semiconductor memory device.
FIG. 2 shows a simulative result for an off-leakage current level per element obtained by producing off-leakage current in each element of a bank.
Figure 3:
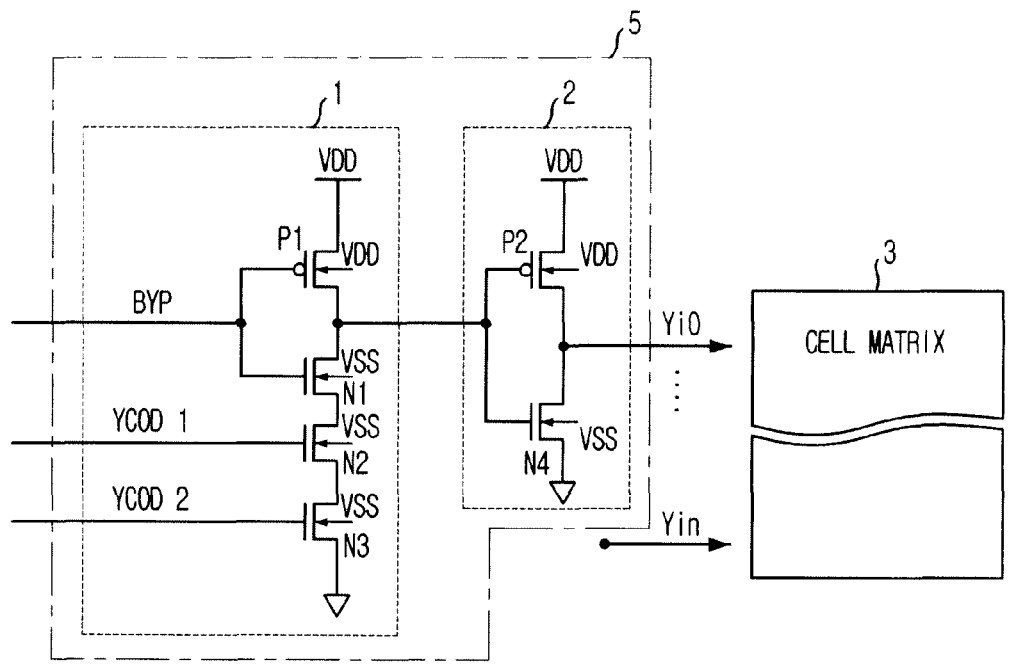
FIG. 3 illustrates a circuit diagram of a conventional column decoder.
Figure 4:
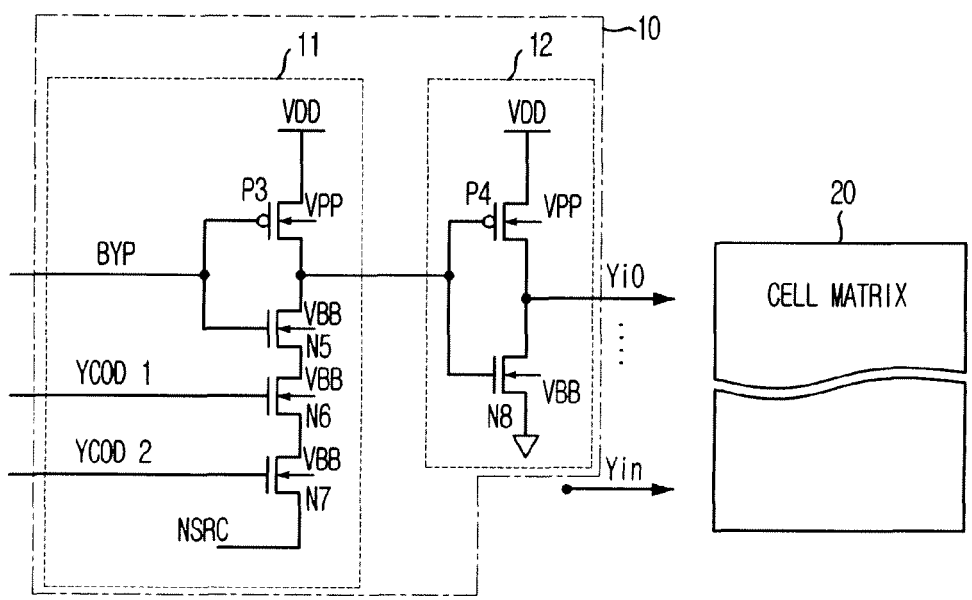
FIG. 4 offers a circuit diagram of a column decoder in accordance with a specific embodiment of the present invention.

FIG. 4 offers a circuit diagram of a column decoder 10 with a cell matrix 20.

The column decoder 10 includes a pre-driving unit 11 and a driving unit 12.

The pre-driving unit 11 has a PMOS transistor P3 and NMOS transistors N5 to N7 connected in series between a power supply voltage terminal VDD and a node receiving a voltage source control signal NSRC. The voltage source control signal NSRC has a voltage level of a ground voltage VSS or a back-bias voltage VBB, wherein a voltage level of the back-bias voltage VBB is lower than that of the ground voltage VSS. The PMOS transistor P3 and the NMOS transistor N5 have a common gate receiving a control signal BYP, the control signal BYP being a pulse signal containing bank information. Further, they have a common drain which acts as an output node of the pre-driving unit 11 to output a state output signal to the driving unit 12. The NMOS transistors N6 and N7 are respectively coupled with code signals YCOD1 and YCOD2 through their gates and the code signals YCOD1 and YCOD2 have codes containing column address information for a corresponding cell of a multiplicity of cells in the cell matrix 20.

The driving unit 12 has a PMOS transistor P4 and an NMOS transistor N8 connected in series between the power supply voltage terminal VDD and a ground voltage terminal VSS. The PMOS transistor P4 and the NMOS transistor N8 have a common gate acting as an input node of the driving unit 12 and a common drain acting as an output node of the driving unit 12. The driving unit 12 receives the state output signal through the input node connected to the output node of the pre-driving unit 11 and outputs a column selection signal Yi to the cell matrix 20. The column selection signal Yi is used to select a corresponding cell designated by the two-code signals YCOD1 and YCOD2, in the cell matrix 20.

The PMOS transistors P3 and P4 are provided with a pumping voltage VPP through their bulk and the NMOS transistors N5 to N8 receive the back-bias voltage VBB through their bulk, wherein a voltage level of the pumping voltage VPP is higher than that of the power supply voltage VDD.

For the purpose of forming one bank, a plurality of above-assembled column decoders are required, and further, one or more column selection signals Yi0 to Yin are provided from the plurality of column decoders to the cell matrix 20.

The activation of the pre-driving unit 11 is determined according to whether or not codes of both of the code signals YCOD1 and YCOD2 required for the column selection are identical to each other and have an enabled state. If the codes of the two code signals YCOD1 and YCOD2 are identical to each other as a logic high level, the pre-driving unit 11 is activated. Then a corresponding column decoder, e.g., 10, is selected from the plurality of column decoders, such that a corresponding column selection signal, e.g., Yi0, is enabled and outputted from the driving unit 12.

In specific, when a column access operation for the column selection is not performed, the control signal BYP is disabled to a logic low level, thereby setting the column selection signal Yi to a logic low level. On the other hand, when the column access operation for column selection is performed, the control signal BYP is enabled to a logic high level. Under a condition that the control signal BYP is enabled, if the codes of the code signals YCOD1 and YCOD2 of the column decoder 10 have a logic high level, the pre-driving unit 11 is activated, such that the PMOS transistor P4 of the driving unit 12 is turned on and the column selection signal Yi0 is enabled and provided to the cell matrix 20.

In the column decoder 10 of the present invention, the PMOS transistors P3 and P4 receive as a bulk bias voltage the pumping voltage VPP whose voltage level is higher than that of the power supply voltage VDD and the NMOS transistors N5 to N8 receive as a bulk bias voltage the back-bias voltage VBB whose voltage level is lower than that of the ground voltage VSS. In addition, the NMOS transistor N7 receives the source voltage control signal NSRC having a voltage level of either the ground voltage VSS or the back-bias voltage VBB through its source.

Figure 5:
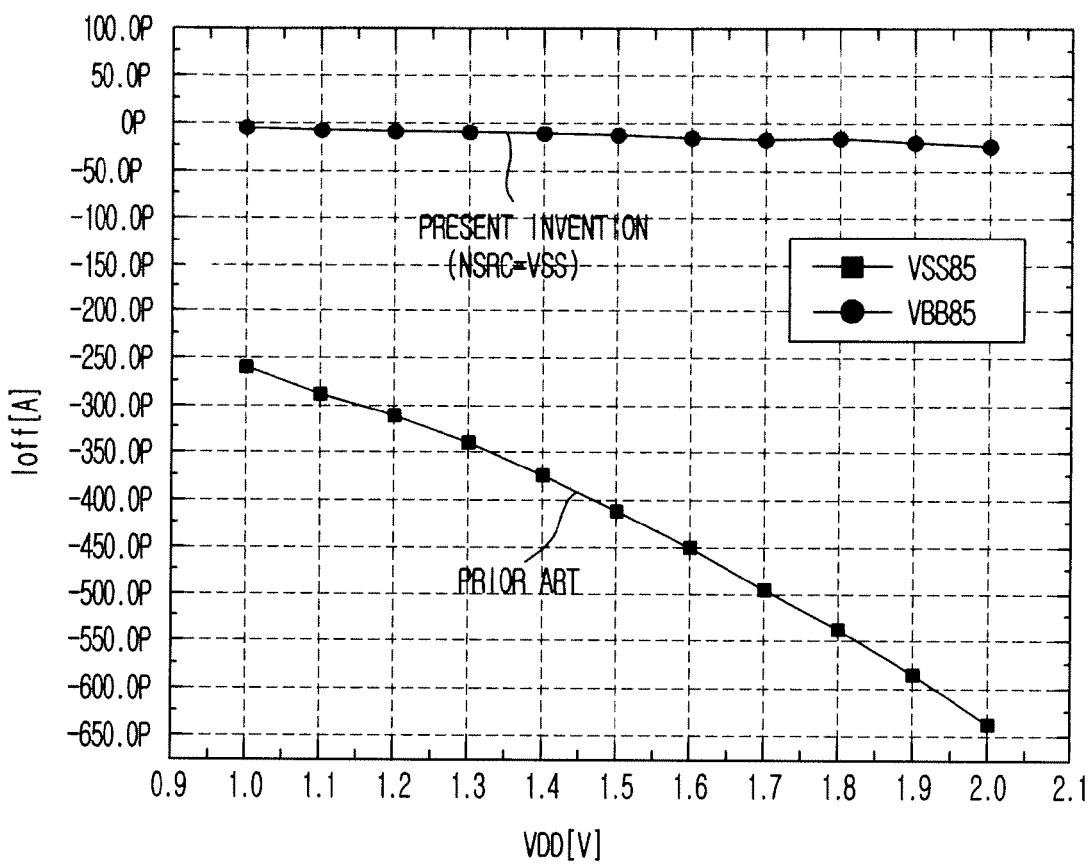
FIG. 5 provides a comparative graph of off-leakage currents occurring in a column decoder in accordance with an embodiment of the invention and in a conventional column decoder.

FIG. 5 provides a comparative graph of off-leakage currents occurring in an example of the inventive column decoder 10 and the conventional column decoder 5.

As seen from the comparative graph, the conventional column decoder exhibits a drop-off variation of off-leakage current as a function of power supply voltage VDD and has an approximately −540 pA off-leakage current per column decoder at about 1.8V of the power supply voltage VDD.

However, for the inventive column decoder 10, assuming that the source voltage control signal NSRC has a voltage level of the ground voltage VSS, the pumping voltage VPP represents 3.3V, and the temperature is at high temperature of 85° C. where the characteristics of off-leakage current are apparent, it is noted that the off-leakage current as a function of the power supply voltage VDD is sufficiently reduced and variation in characteristics of off-leakage current is very small, compared to the conventional column decoder. Therefore, it will be understood that the present invention can advantageously control the bulk bias voltage of the column decoder 10 by using the pumping voltage VPP and the back-bias voltage VBB, such that the characteristics of off-leakage current can be improved.

Figure 6:
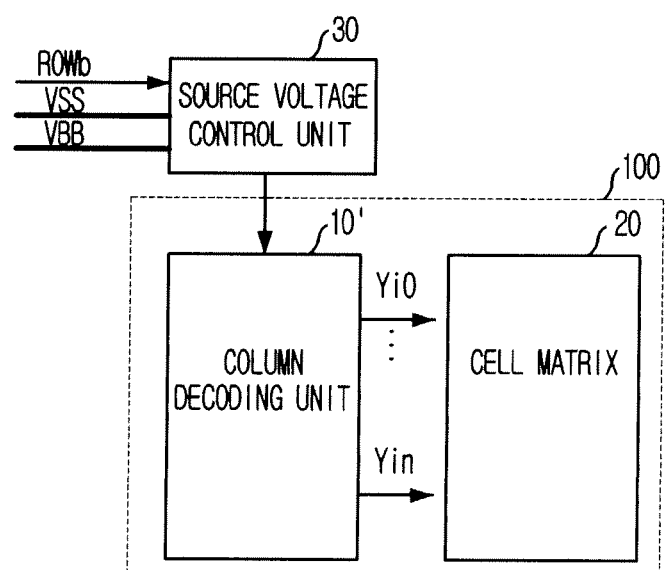
FIG. 6 presents a block diagram of the inventive column decoder and a source voltage control unit in accordance with another specific embodiment of the present invention.

FIG. 6 presents a diagram of a bank 100 of a semiconductor memory device including a column decoding unit 10', the cell matrix 20 and a source voltage control unit 30, wherein the column decoding unit 10' contains a plurality of column decoders.

The source voltage control unit 30 receives a row active signal ROWb to provide the column decoding unit 10' with the source voltage control signal NSRC having either the ground voltage VSS or the back-bias voltage VBB according to whether the row active signal ROWb indicates an active mode or a standby mode.

The source voltage control unit 30 is disposed on lines of the ground voltage VSS and the back-bias voltage VBB.

In the case where the row active signal ROWb inputted into the bank 100 has, e.g., a logic low level, this indicates the active mode in which a certain row is selected to perform a normal read or write operation; and the other case where the row active signal ROWb has, e.g., a logic high level, this indicates the standby mode in which a pre-charge operation is performed.

The source voltage control unit 30 is switched depending on such a state of the row active signal ROWb, i.e., the active mode or the standby mode, to feed the source voltage control signal NSRC into the column decoding unit 10', e.g., the source of the NMOS transistor N7 of the pre-driving unit 11 of the column decoder 10 described in FIG. 4.

The source of the NMOS transistor N7 of the pre-driving unit 11 is controlled based on the source voltage control signal NSRC, and the pumping voltage VPP and the bias voltage VBB are respectively applied into the bulk of the PMOS transistor P3 and each bulk of the NMOS transistors N5 to N7. Subsequently, if a certain column decoder, e.g., the column decoder 10, of the column decoding unit 10' is selected, the column selection signal Yi0 indicating an address of the corresponding cell designated by the two code signals YCOD1 and YCOD2 is enabled and coupled to the cell matrix 20.

Figure 7:
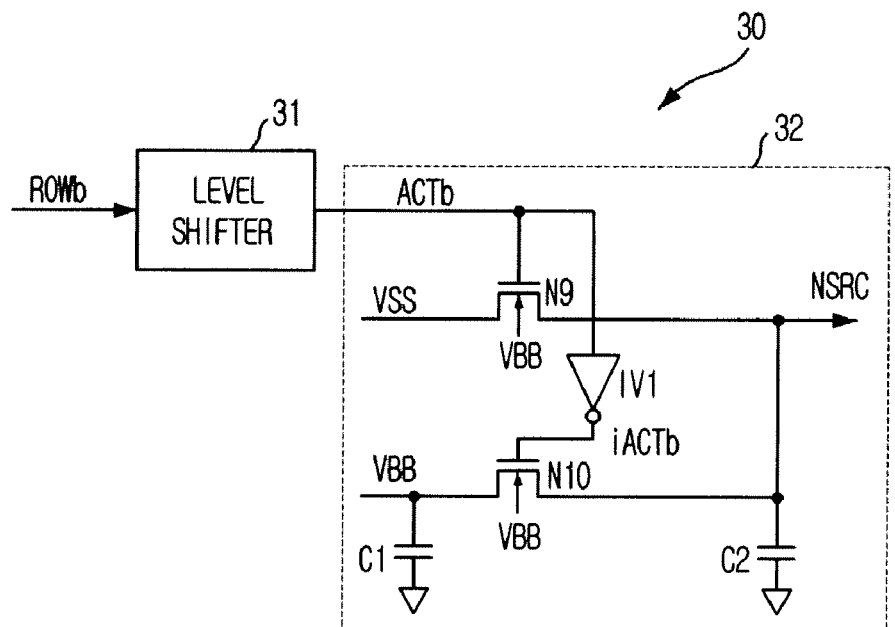
FIG. 7 depicts a circuit diagram of the source voltage control unit in FIG. 6.

FIG. 7 depicts a circuit diagram of the source voltage control unit 30 of FIG. 6 including a level shifter 31 and a voltage selection unit 32.

The level shifter 31 level-shifts the row active signal ROWb to generate an active signal ACTb, a voltage level of the active signal ACTb alternatively being swung between the power supply voltage VDD and the back-bias voltage VBB.

The voltage selection unit 32 has NMOS transistors N9 and N10 as well as an inverter IV1 and capacitors C1 and C2. The NMOS transistor N9 is connected between the ground voltage terminal VSS and an output node outputting the source voltage control signal NSRC and receives the active signal ACTb through its gate. The NMOS transistor N10 is connected between a back-bias voltage terminal providing the back-bias voltage VBB and the output node and receives an inverted active signal iACTb outputted from the inverter IV1 through its gate. The capacitor C1 is a parasitic capacitor existing between the back-bias voltage terminal and the ground voltage terminal and the capacitor C2 is a parasitic capacitor existing between the output node and the ground voltage terminal, wherein the capacitor C1 is usually selected to have a capacitance hundreds to thousands of times larger than that of the capacitor C2.

Figure 8:
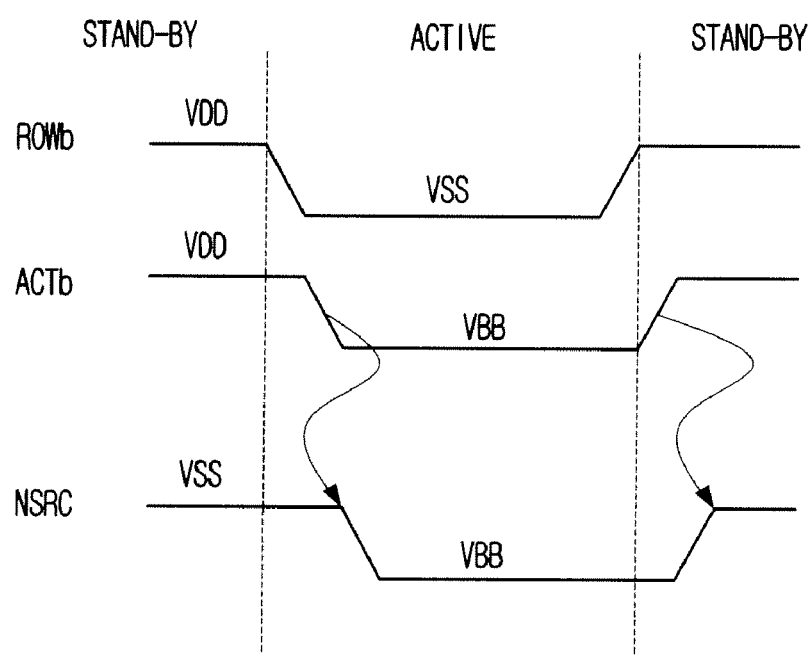
FIG. 8 represents an operational timing diagram of the source voltage control unit in accordance with the present invention.

The operation of the source voltage control unit 30 will be described with reference to an operational timing diagram of FIG. 8.

First, in the standby mode, both of the row active signal ROWb and the active signal ACTb have a voltage level of power supply voltage VDD. Therefore, the NMOS transistor N9 is turned on and the NMOS transistor N10 is turned off, thereby outputting the source voltage control signal NSRC having the voltage level of the power supply voltage VDD. As a result, in the standby mode, the source voltage control signal NSRC having the voltage level of the ground voltage VSS is inputted into the pre-driving unit 11 of the column decoder 10.

On the other hand, in the active mode, the level shifter 31 level-shifts the row active signal ROWb to output the active signal ACTb, wherein the row active signal ROWb has the voltage level of the ground voltage VSS and thus the active signal ACTb changes to the voltage level of the back-bias voltage VBB. At this time, such a level shifting is likely to be disregarded because the capacitance of capacitor C1 is hundreds to thousands of times larger than that of capacitor C2. Thereafter, the NMOS transistor N9 is turned off and the NMOS transistor N10 is turned on, thereby outputting the source voltage control signal NSRC having the voltage level of the back-bias voltage VBB. As a result, in the active mode, the source voltage control signal NSRC having the voltage level of back-bias voltage VBB is inputted into the pre-driving unit 11 of the column decoder 10.

That is, when changing the bulk bias voltage of the column decoder 10 to reduce the off-leakage current, a threshold voltage of each connected transistor in the column decoder 10 becomes higher and thus a driving force thereof is lowered, resulting in the reduction of the operational speed. To overcome this problem, the present invention employs the source voltage control signal NSRC such that the source voltage control signal NSRC having the back-bias voltage VBB is inputted into the source of the NMOS transistor N7 in the pre-driving unit 11 when the row active signal ROWb is enabled to a logic low level, i.e., in the active mode.

As a result, the PMOS transistor P4 of the driving unit 12 receives a selective negative voltage, i.e., the ground voltage VSS or the back-bias voltage VBB through its gate and thus can have a sufficient driving force to improve the operational speed deteriorated by the off-leakage current. Therefore, in accordance with the present invention, it is possible to achieve low-power characteristics in the standby mode and a high operational speed in the active mode.

Figure 9:
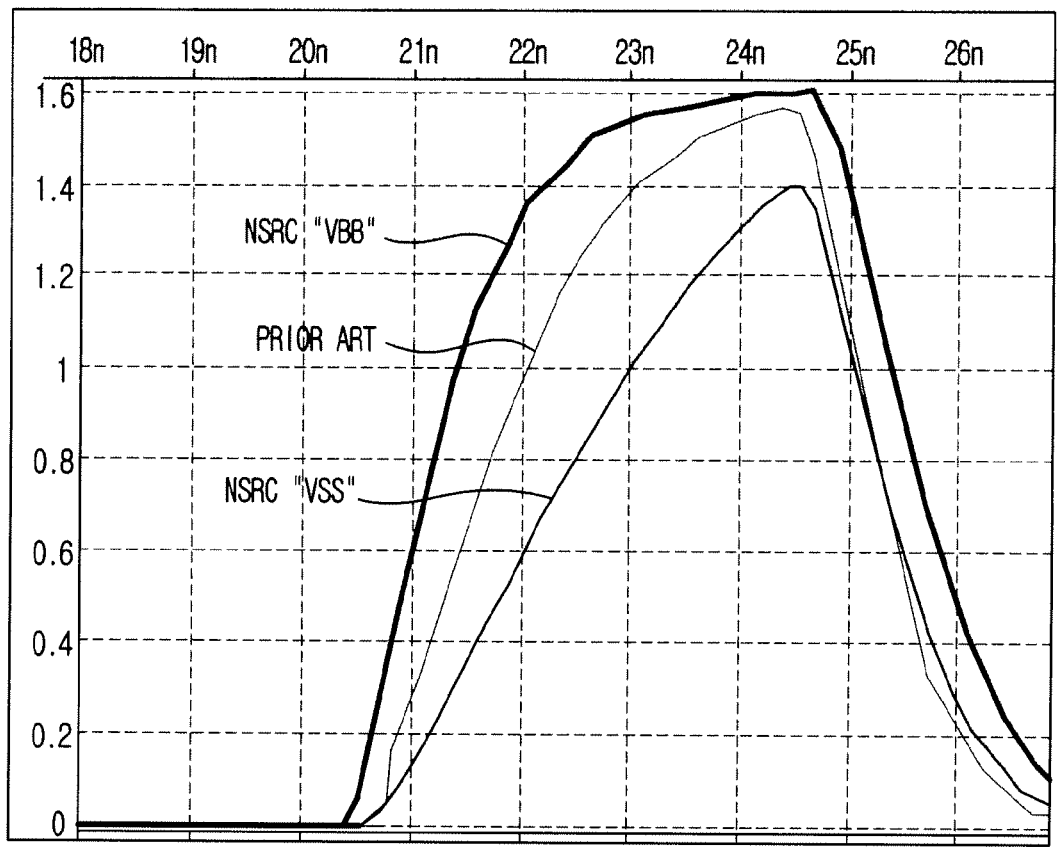
FIG. 9 offers a comparative graph of column selection signals in the inventive column decoder and the conventional column decoder.

FIG. 9 represents a comparative graph of the column selection signals generated by the inventive column decoder 10 and the conventional column decoder 5 according to a voltage level of the source voltage control signal NSRC. Referring to FIG. 9, where horizontal axis refers to time and vertical axis refers to column selection signal voltage, it is noted that the column selection signal has the fastest rising characteristics when the source voltage control signal NSRC is controlled to have a voltage level of the back-bias voltage VBB in the active mode.

Figure 10:
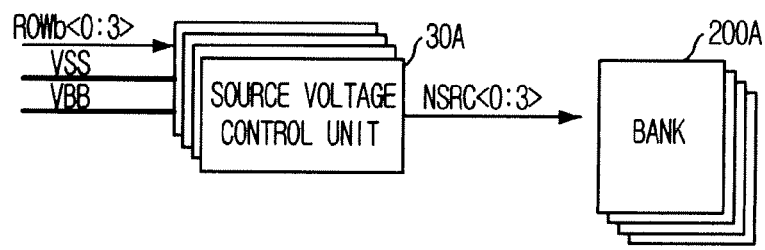
FIG. 10 describes a diagram of a semiconductor memory device employing a source voltage control unit in accordance with still another specific embodiment of the present invention.

FIG. 10 depicts a diagram of a semiconductor memory device employing a source voltage control unit in accordance with a specific embodiment of the present invention.

The circuit of FIG. 6 holds only one source voltage control unit 30 for the bank 100 while that of FIG. 10 includes a multiplicity of source voltage control units 30A for a number of banks 200A. The multiplicity of source voltage control units 30A output source voltage control signals NSRC<0:3> for accessing all of the banks 200A.

Figure 11:
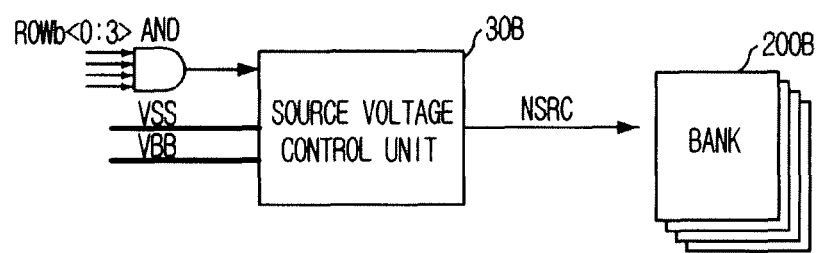
FIG. 11 illustrates a diagram of a semiconductor memory device employing a source voltage control unit in accordance with further still another specific embodiment of the present invention.

FIG. 11 is a diagram of a semiconductor memory device employing a source voltage control unit in accordance with another specific embodiment of the present invention.

The circuit of FIG. 11 is similar to that of FIG. 10, except that a single source voltage control unit 30B for a number of banks 200B exists therein. Thus a logic gate AND is employed, such that when at least one of the row active signals ROWb<0:3> is enabled, the source voltage control signal NSRC is level-shifted to a voltage level of the back-bias voltage VBB and coupled to all of the banks 200B.

In the exemplary structure of FIG. 11, it is possible to minimize the layout size since the circuit is constructed by only one source voltage control unit 30B whose structure is the same as that of FIG. 7. Specially, the circuit of FIG. 11 is advantageously used in case where the capacitor C1 employed therein has a capacitance hundreds to thousands of times larger than that of the capacitor C2.

Figure 12:
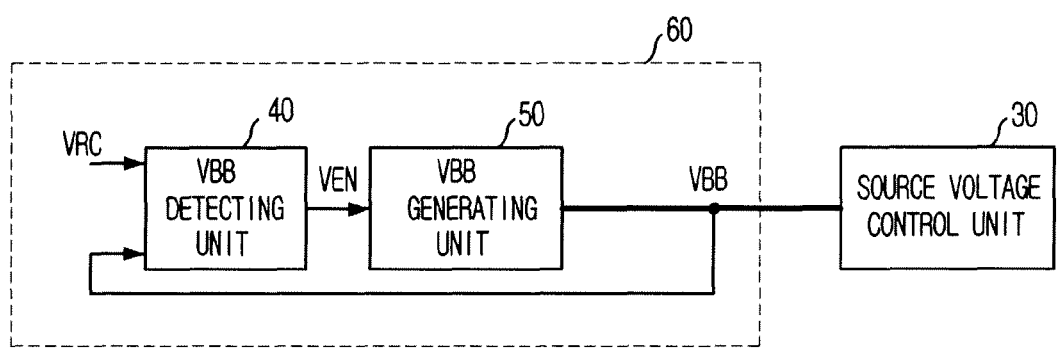
FIG. 12 shows a block diagram of a back-bias voltage generator in accordance with an embodiment of the present invention.

FIG. 12 represents a block diagram of a back-bias voltage generator connected to the source voltage control unit in accordance with the present invention.

The back-bias voltage generator 60 includes a back-bias voltage (VBB) detecting unit 40 and a VBB generating unit 50.

The VBB detecting unit 40 receives the back-bias voltage fed back from the VBB generating unit 50 and detects a voltage level of the fed back VBB based on a reference voltage VRC, thereby outputting an enable signal VEN, wherein the reference voltage VRC has a voltage level substantially the same as that of the ideal back-bias voltage. The VBB generating unit 50 generates the back-bias voltage VBB whose voltage level is regulated in response to the enable signal VEN. The VBB generating unit 50 outputs the back-bias voltage VBB to the source voltage control unit 30.

The back-bias voltage generator 60 is used to prevent the voltage level of the back-bias voltage VBB from being changed.

As seen from the above-description, the present invention controls the bulk bias voltage for the column decoder in which the greatest amount of off-leakage current occurs, resulting in the reduction of the total amount of off-leakage current occurring in the semiconductor memory device, and further, selectively adjusts a voltage level of the voltage source control signal applied into the pre-driving unit of the column decoder to improve an access operational speed.

While the invention has been shown and described with respect to the preferred embodiments, it will be understood by those skilled in the art that various changes and modifications may be made without departing from the spirit and scope of the invention as defined in the following claims.

What is claimed is:

1. A semiconductor memory device, comprising:
a pre-driving unit configured to output a state output signal transitioning between a power supply voltage and a source voltage in response to code signals containing address information for cells;
a driving unit configured to output a selection signal to activate a corresponding one of the cells in response to the state output signal; and
a source voltage control unit configured to provide the source voltage whose voltage level changes depending on an operational mode of the semiconductor memory device,
wherein the pre-driving unit includes at least one PMOS transistor and at least one NMOS transistor to receive a pumping voltage and a back-bias voltage, respectively, through their bulk, and the pumping voltage having a voltage level higher than that of the power supply voltage and the back-bias voltage having a voltage level lower than that of a ground voltage.

2. The semiconductor memory device as recited in claim 1, wherein the pre-driving unit receives the back-bias voltage as the source voltage in an active mode, and the pre-driving unit receives the ground voltage as the source voltage in an standby mode.

3. The semiconductor memory device as recited in claim 1, wherein the pre-driving unit includes:
   a PMOS transistor connected between a terminal of the power supply voltage and an output node through which the state output signal is outputted; and
   a plurality of NMOS transistors connected in series between the output node and a terminal of the source voltage,
   wherein the PMOS transistor and one of the NMOS transistors receive a control signal to activate the pre-driving unit through their common gate and the remaining NMOS transistors receive the code signals through a gate thereof, respectively.

4. The semiconductor memory device as recited in claim 1, wherein the driving unit includes a PMOS transistor and an NMOS transistor which receive the pumping voltage and the back-bias voltage, respectively, through their bulk.

5. The semiconductor memory device as recited in claim 4, wherein the PMOS transistor is connected between a terminal of the power supply voltage and an output node through which the selection signal is outputted, and the NMOS transistor is connected between the output node and a terminal of the ground voltage, wherein the PMOS transistor and the NMOS transistor receive the state output signal through their common gate.

6. The semiconductor memory device as recited in claim 1, further comprising a cell matrix including a plurality of cells,
   wherein the code signals contains column address information of the cells.

7. The semiconductor memory device as recited in claim 1, wherein the source voltage control unit includes:
   a level shifter configured to receive and level shift a row active signal to generate an active signal, the row active signal indicating the operational mode; and
   a voltage selection unit configured to provide the source voltage whose voltage level is determined in response to the active signal.

8. The semiconductor memory device as recited in claim 7, wherein the voltage selection unit includes:
   an inverter configured to invert the active signal;
   a first transistor connected between a terminal of the source voltage and a terminal of the ground voltage and controlled by the active signal; and
   a second transistor connected between the terminal of the source voltage and a terminal of the back-bias voltage and controlled by an inverted active signal.

9. The semiconductor memory device as recited in claim 8, wherein the first transistor is turned on to provide the ground voltage to the terminal of the source voltage when the row active signal indicates a standby mode.

10. The semiconductor memory device as recited in claim 9, wherein the second transistor is turned on to provide the back-bias voltage to the terminal of the source voltage when the row active signal indicates an active mode.

11. The semiconductor memory device as recited in claim 8, wherein the voltage selection unit further includes:
   a first capacitor being a parasitic capacitor which exists between the terminal of the back-bias voltage and the terminal of the ground voltage; and
   a second capacitor being a parasitic capacitor which exists between the terminal of the source voltage and the terminal of the ground voltage,
   wherein a capacitance of the first capacitor is greater than that of the second capacitor.

12. The semiconductor memory device as recited in claim 11, wherein the capacitance of the first capacitor is hundreds to thousands of times greater than that of the second capacitor.

* * * * *